United States Patent [19]

Hockemeyer et al.

[11] Patent Number: 4,597,987

[45] Date of Patent: Jul. 1, 1986

[54] ORGANOPOLYSILOXANES CONTAINING BOTH ACRYLOXYALKYL GROUPS AND SI-BONDED HYDROGEN ATOMS IN THE SAME MOLECULE

[75] Inventors: Friedrich Hockemeyer, Emmerting; Gerhard Preiner, Burghausen, both of Fed. Rep. of Germany

[73] Assignee: Wacker-Chemie GmbH, Munich, Fed. Rep. of Germany

[21] Appl. No.: 622,342

[22] Filed: Jun. 18, 1984

Related U.S. Application Data

[62] Division of Ser. No. 493,500, May 11, 1983, Pat. No. 4,558,111.

[30] Foreign Application Priority Data

Jun. 18, 1982 [DE] Fed. Rep. of Germany ....... 3222839

[51] Int. Cl.$^4$ .............................................. B05D 3/06
[52] U.S. Cl. ..................................... 427/54.1; 427/44; 427/208.4; 428/447; 428/448; 428/451; 428/452; 528/26; 528/29; 528/31; 528/32; 556/437; 556/440
[58] Field of Search ..................... 427/54.1, 44, 208.4; 428/447, 448, 451, 452; 528/26, 29, 31, 32; 556/437, 440

[56] References Cited

U.S. PATENT DOCUMENTS 4,011,247  3/1977  Sato et al. .............................. 528/15

Primary Examiner—Melvyn I. Marquis

[57] ABSTRACT

Organopolysiloxanes having a viscosity of at least 100 mPa.s at 25° C. and having both SiC-bonded acryloxyalkyl groups and Si-bonded hydrogen atoms in the same molecule are described herein. These are preferably prepared by adding an allyl alcohol to diorganopolysiloxanes containing an Si-bonded hydrogen atom in each of their terminal units, then esterifying the hydroxyl groups of the resultant reaction product with acrylic acid and subsequently equilibrating the resultant diorganopolysiloxanes containing an SiC-bonded acryloxypropyl group in each of their terminal units, with organo(poly)siloxanes containing an Si-bonded hydroxyl group in each of their terminal units, in which the organo(poly)siloxanes contain methylhydrogensiloxane units and optionally diorganosiloxane units of the formula $R_2SiO$ 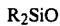

as well as other organo(poly)siloxanes. These organopolysiloxanes may be crosslinked by high energy radiation and are useful as adhesive-repellent coatings for paper or for manufacturing optical glass fibers.

6 Claims, No Drawings

ORGANOPOLYSILOXANES CONTAINING BOTH ACRYLOXYALKYL GROUPS AND SI-BONDED HYDROGEN ATOMS IN THE SAME MOLECULE

This is a division of application Ser. No. 493,500, filed May 11, 1983 now U.S. Pat. No. 4,558,111.

The present invention relates to novel organopolysiloxanes and particularly to novel organopolysiloxanes having both SiC-bonded acryloxyalkyl groups and Si-bonded hydrogen atoms in the same molecule. More particularly, the present invention relates to a process for preparing novel organopolysiloxanes which may be cross-linked with a high-energy source of radiation.

BACKGROUND OF THE INVENTION

Photopolymerizable organopolysiloxane compositions containing SiC-bonded acryloxyalkyl or methacryloxyalkyl groups are known in the art. For example European Patent No. 016,663 to Rhone-Poulenc Industries, describes photopolymerizable organopolysiloxane compositions containing SiC-bonded acryloxyalkyl or methacryloxyalkyl groups which may be used to prepare adhesive-repellent coatings. In contrast to the organopolysiloxanes described in the European patent, the organopolysiloxanes of this invention cross-link much more rapidly in the presence of atmospheric oxygen.

Also, U.S. Pat. No. 4,011,247 to Sato et al, describes organopolysiloxanes containing both SiC-bonded acryloxyalkyl groups and Si-bonded hydrogen atoms in the same molecule. However, the organopolysiloxanes described heretofore have viscosities of less than 100 mPa.s at 25° C., in order that they may be purified by distillation. Moreover, U.S. Pat. No. 4,011,247 does not disclose using the organopolysiloxanes described therein for adhesive-repellent coatings, nor are they likely to be suitable for such use.

Therefore, it is an object of the present invention to provide a novel organopolysiloxane having a viscosity of at least 100 mPa.s at 25° C. and SiC-bonded acryloxyalkyl groups and Si-bonded hydrogen atoms in the same molecule. Another object of the present invention is to provide a process for preparing an organopolysiloxane having SiC-bonded acryloxyalkyl groups and Si-bonded hydrogen atoms in the same molecule. Still another object of the present invention is to provide an organopolysiloxane having a viscosity of at least 100 mPa.s at 25° C. and having SiC-bonded acryloxyalkyl groups and Si-bonded hydrogen atoms in the same molecule which may be used for coating substrates. A further object of the present invention is to provide an organopolysiloxane having a viscosity of at least 100 mPa.s at 25° C. and having SiC-bonded acryloxyalkyl groups and Si-bonded hydrogen atoms in the same molecule, which may be cross-linked by high energy radiation.

SUMMARY OF THE INVENTION

The foregoing objects and others which will become apparent from the following description are accomplished in accordance with this invention, generally speaking, by providing organopolysiloxanes containing SiC-bonded acryloxyalkyl groups and Si-bonded hydrogen in the same molecule in which the organopolysiloxanes have a viscosity of at least 100 mPa.s at 25° C. and no more than $10.10^6$ mPa.s at 25° C., with an average viscosity which does not exceed about 3000 mPa.s at 25° C.

DESCRIPTION OF THE INVENTION

The organopolysiloxanes having both SiC-bonded acryloxyalkyl groups and Si-bonded hydrogen groups per molecule preferably contain siloxane units of the general formula $$CH_2=CHCOO(CH_2)_nSiR_2O_{\frac{1}{2}}, R_2SiO \text{ and } CH_3HSiO,$$

where R represents the same or different monovalent hydrocarbon radicals or substituted monovalent hydrocarbon radicals and n is 1, 2, 3 or 4. Preferably n is equal to 3.

It is preferred that the organopolysiloxanes of this invention contain at least 2 and have a maximum of 4 units of the formula $$CH_2=CHCOO(CH_2)_nSiR_2O_{\frac{1}{2}}.$$

Also, It is preferred that units having the formula $$R_2SiO$$

be present in an amount of at least 10 percent and not exceed about 95 percent of the total number of siloxane units present in the organopolysiloxanes of this invention.

It is preferred that units of the formula $$CH_3HSiO$$

be present in an amount of from 0.2 to 75 percent and more preferably from about 5 to 20 percent of the total number of siloxane units present in the preferred organopolysiloxanes of this invention.

In addition to the aforementioned siloxane units, the preferred organopolysiloxanes of this invention may also contain units of either of the following formulas $$RSiO_{3/2} \text{ or } R^1R_2SiO_{\frac{1}{2}}$$

where R is the same as above, $R^1$ is hydrogen or is the same as R. However, it is preferred that the units described above not exceed about 10 percent of the total number of siloxane units in the organopolysiloxanes of this invention.

The total number of siloxane units present in the organopolysiloxanes of this invention must of course always add up to 100 percent.

Although, it is not preferred, the units of the formula $$CH_2=CHCOO(CH_2)_nSiR_2O_{\frac{1}{2}}$$

may be partially or entirely substituted with units selected from the following formulas $$CH_2=CHCOO(CH_2)_nSiRO \text{ and}$$
$$CH_2=CHCOO(CH_2)_nSiO_{3/2},$$

or mixtures thereof, where R and n are the same as above.

Examples of hydrocarbon radicals represented by R and $R^1$ in the above formulas are alkyl radicals having from 1 to 18 carbon atoms per radical, such as the methyl, ethyl, n-propyl, isopropyl, n-butyl and the sec-butyl radical, as well as octadecyl radicals; cycloalkyl radicals having from 5 to 8 carbon atoms per radical, such as the cyclohexyl and the cycloheptyl radical, as well as methylcyclohexyl radicals; radicals having aliphatic double bonds, such as the vinyl and the allyl radical. These radicals may be present with aliphatic double bonds, especially as $R^1$ radicals. Other examples are aryl radicals such as the phenyl radical and xenyl radical; alkaryl radicals such as the tolyl radicals; and aralkyl radicals such as the benzyl and the beta-phenylethyl radical.

Examples of substituted hydrocarbon radicals represented by R and $R^1$ in the above formulas are halogenated hydrocarbon radicals such as the 3-chloropropyl and the 3,3,3-trifluoropropyl radical and o-, p- and m-chlorophenyl radicals.

Because of their availability, it is preferred that at least 95 percent of the R and $R^1$ radicals be methyl radicals.

In another embodiment of this invention, the organopolysiloxanes containing SiC-bonded acryloxyalkyl groups and Si-bonded hydrogen in the same molecule and have a viscosity of at least 100 mPa.s at 25° C., are prepared by reacting an allyl alcohol with diorganopolysiloxanes having an Si-bonded hydrogen atom in each of their terminal units, then esterifying the hydroxyl groups of the resultant reaction product, with acrylic acid and thereafter equilibrating the thus formed diorganopolysiloxanes having an SiC-bonded acryloxypropyl group in each of their terminal units, with organo(poly)siloxanes containing an Si-bonded hydroxyl group in each of their terminal units, in which the organo(poly)siloxanes contain methylhydrogensiloxane units and optionally siloxane units of the following formula $R_2SiO$, where R is the same as above, as well as still other organo(poly)siloxanes, in which the proportion of monofunctional siloxane units must be selected so that the organopolysiloxanes obtained by equilibration have a viscosity of at least 100 mPa.s at 25° C.

The diorganopolysiloxanes employed in the first stage of the process of this invention and which have an Si-bonded hydrogen atom in each of their terminal units, can be represented by the following formula $HSiR_2O(SiR_2O)_mSiHR_2$ where R is the same as above and m represents an integer having a value of at least 1. The addition of allyl alcohol to both Si-bonded hydrogen atoms can be achieved with any catalyst which promotes the addition of Si-bonded hydrogen to an aliphatic multiple bond. Examples of suitable catalysts are platinum compounds and complexes, such as $H_2PtCl_6.6H_2O$. The addition of allyl alcohol to the diorganopolysiloxane containing an Si-bonded hydrogen atom in each of its terminal units may take place at any of the temperatures and pressures which could heretofore be used for the addition of Si-bonded hydrogen to an aliphatic multiple bond. However, it is preferred that temperatures of from 20° to 150° C. and atmospheric pressure be employed. It is preferred that 1 gram/mole of allyl alcohol be used per gram/atom of Si-bonded hydrogen. The reaction products obtained in the first stage of the process of this invention correspond to the following formula:

$HO(CH_2)_3SiR_2O(SiR_2O)_mSiR_2(CH_2)_3OH$, where R and m are the same as above.

The hydroxyl groups present in the reaction products obtained in the first stage of the process of this invention are esterified with acrylic acid in the presence of an easily available fixed-bed catalyst, such as acid-treated montmorillonite which can subsequently be removed from the reaction product by simple filtration. The esterification reaction of the acrylic acid with the hydroxyl groups present in the reaction products obtained in the first stage of the process of this invention may take place at any of the temperatures and pressures which could heretofore be used for the esterification of hydroxyl groups with carboxylic acids. Temperatures in the range of from 50° to 180° C. at atmospheric pressure is preferred. It is preferred that at least 1 gram/mole of acrylic acid be employed per gram/mole of hydroxyl group. The diorganopolysiloxanes having an SiC-bonded acryloxypropyl group in each of their terminal units, which are obtained from the second stage of the process of this invention have the following formula:

$CH_2{=}CHCOO(CH_2)_3SiR_2O(SiR_2O)_mSiR_2(CH_2)_3OOCH{=}CH_2$ where R and m are the same as above.

The diorganopolysiloxanes having an SiC-bonded acryloxypropyl group in each of its terminal units are equilibrated in the third stage of the process of this invention with organo(poly)siloxanes having an Si-bonded hydroxyl group in each of their terminal units and consist of methylhydrogensiloxane units and optionally siloxane units of the formula $R_2SiO$ where R is the same as above. The organopolysiloxanes having an Si-bonded hydroxyl group in each of their terminal units and which consist of methylhydrogensiloxane units and optionally of siloxane units of the formula $R_2SiO$ can be represented by the following general formula $H(OSiCH_3H)_e(OSiR_2)_pOH$ where R is the same as above, e represents an integer having a value of at least 1, and p is 0 or an integer having a value of at least 1.

The other organopolysiloxanes which may be used in the third stage of the process of this invention may consist of, for example, diorganopolysiloxanes having an Si-bonded hydroxyl group in each of their terminal units, especially dimethylpolysiloxanes having an Si-bonded hydroxyl group in each terminal unit, as well as cyclic diorganopolysiloxanes such as octamethylcyclotetrasiloxanes, or copolymers consisting of units of the following formulas:

$R_2SiO$ and $RSiO_{3/2}$ where R is the same as above.

It is preferred that acid catalysts which promote the equilibration process be used in the third stage of the process of this invention. Examples of suitable catalysts are sulfuric acid, phosphoric acid, trifluoromethane acid, phosphoronitrile chloride and other acid catalysts which are solid under the reaction conditions, such as acid-activated bleaching earth, acid zeolites, sulfonated carbon and sulfonated styrene-divinylbenzene copolymers. The preferred catalyst is phosphoronitrile chlorides. The phosphornitrile chlorides are preferably used in an amount of from 5 to 1000 ppm by weight, and more preferably from about 50 to 200 ppm by weight, based on the total weight of the organosilicon compounds present.

In order to obtain a high volume/time yield, it is preferred that the first and second stage of the process of this invention be carried out in the absence of a solvent. The equilibration reaction, which takes place during the third stage of the process of this invention, is preferably conducted in the presence of at least 10 percent by weight of a solvent which is immiscible in water, for example toluene, based on the total weight of the organosilicon compounds and the solvent, in order to retard or inhibit cross-linking of the organopolysiloxane through condensation of the Si-bonded hydrogen with Si-bonded hydroxyl groups.

Organopolysiloxanes having monofunctional siloxane units of the formula $$CH_2=CHCOO(CH_2)_3SiR_2O_{\frac{1}{2}}$$

may be employed in the equilibration reaction to control the viscosity of the resultant organopolysiloxanes.

The viscosity of the organopolysiloxanes obtained from the equilibration is affected inversely with the proportion of such siloxane units, i.e., when the proportion of such units increases, the viscosity of the resultant orgnopolysiloxnes decreases.

The catalyst can be neutralized, for example, by the addition of trioctylamine prior to the processing of the mixtures resulting from the equilibration.

In another embodiment of this invention, the organopolysiloxanes which contain both SiC-bonded acryloxyalkyl groups and Si-bonded hydrogen per molecule and have a viscosity of at least 100 mPa.s at 25° C., may be used in preparing coatings which can be cross-linked by high-energy radiation.

Coatings prepared from the organopolysiloxanes of this invention may be used as protective coatings, or as adhesive repellent coatings or as water-repellent coatings.

Surfaces such as ceramic or glass objects, glass fibers including optical fibers, papers such as Kraft paper or imitation parchment paper, cardboard including asbestos board, fiberglass, wood, cork, plastic foil such as polyethylene foil or polypropylene foil, woven or non-woven fabric made of natural or synthetic fibers or glass fibers, metals and polyethylene-coated Kraft paper or board may be coated with the organopolysiloxanes of this invention. The polyethylene surfaces may be prepared from high-, medium- or low pressure polyethylene.

The organopolysiloxanes of this invention may be applied to the surfaces to be coated by any method which has been or could have been used heretofore in the application of liquid substances to substrates. The surfaces may be coated, for example, by brushing, pouring, spraying, calendering or imprinting with, for example, the aid of an offset coating device, or with a knife or blade, including a Meyer rod, or by using an air brush. If the application takes place by an offset gravure process, the surface which is to be coated may run at a higher rate of speed than the form cylinder.

The organopolysiloxanes of this invention may be applied to the surfaces to be coated with the aid of a solvent, however, it is preferred that solvents be omitted.

Ultraviolet light is the preferred high-energy source of radiation for the cross-linking of the coatings of this invention. However, X-ray, gamma or electron rays may be used as well, or two or more of such rays may be used simultaneously. In addition to high-energy radiation, other sources of radiation which may produce heat, such as infrared, may be used. However, heat is by no means necessary and it is preferred that heat be omitted in order to keep energy expenditures low.

Ultraviolet light having a wavelength in the range of from 200 to 400 nm (nanometers) is preferred.

When the high-energy radiation used for cross-linking the coatings is ultraviolet light, then the organopolysiloxanes of this invention must also contain at least one photosensitizer. Examples of such photosensitizers are acetophenone, 2-ethoxy-2-methylacetophenone, trichlorobutylacetophenone, 2-ethoxy-2-phenylacetophenone, mesityloxide, propiophenone, benzophenone, xanthone, thioxanthon, fluorenone, benzaldehyde, fluorene, anthraquinone, carbazole, 3-methylacetophenone, 4-methylacetophenone, 3-bromoacetophenone, 4-allylacetophenone, p-diacetylbenzene, 3-methoxybenzophenone, 4-methylbenzophenone, 4-chlorobenzophenone, 2,4-bis(trimethylsiloxy)-benzophenone, 4,4'-dimethoxybenzophenone, 4-chloro-4'-benzylbenzophenone, 3-chloroxanthone, 3,9-dichloroxanthone, 3-chloro-8-nonylxanthone, chloro-anthraquinone, Michlers ketone, cinnamic acid, benzoin methylether, anthroquinone-1,5-disulfonic acid disodium salt, 2-naphthalinesulfonyl chloride and benzyl as well as benzyl ketals and hydroxybenzophenones. Photosensitizers, such as bis-(trimethylsiloxy)-benzophenone are preferred because of their soluility in the organopolysiloxanes.

The photosensitizers are preferably used in an amount of from about 0.5 to about 5 percent by weight based on the total weight of the organopolysiloxanes.

In the following examples, all parts and percentages are by weight unless otherwise specified.

EXAMPLE 1

(A) About 116 g (2 mole) of allyl alcohol and 4.6 ml of 1 percent platinum as $H_2PtCl_6.6H_2O$ in isopropnol, are heated in a 2-liter three-necked flask to 80° C., and then 800 g (1 mole) of a diorganopolysiloxane containing an Si-bonded hydrogen atom in each of its terminal units and having the formula:

$$HSi(CH_3)_2O[Si(CH_3)_2O]_9Si(CH_3)_2H,$$

are added dropwise.

The mixture is then agitated for one hour at a temperature of 100° C. The NMR spectrum of the resultant organopolysiloxane indicates that it has the formula $$HO(CH_2)_3Si(CH_3)_2O[Si(CH_3)_2O]_9Si(CH_3)_2(CH_2)_3OH.$$

After the organopolysiloxane has cooled to 50° C., it is mixed with 100 g of acid-treated montmorillonite, 432 g (6 mole) of acrylic acid and 0.65 g of bis-(tert-butyl)-cresol, which inhibits the polymerization of the acrylic acid, and the resultant mixture is then heated for 2 hours at 110° C. The mixture is then separated from the montmorillonite by filtration. After the volatile materials have been distilled off at a temperature up to 80° C. at 130 mPa.s, 860 g (90.6 percent of theory) of a slightly yellowish, clear oil of low viscosity are obtained. According to the NMR spectrum, the oil has the formula $$CH_2{=}CHCOO(CH_2)_3Si(CH_3)_2O[Si(CH_3)_2O]_9{-}Si(CH_3)_2(CH_2)_3OOCHC{=}CH_2.$$

(B) About 532 g of a dimethylpolysiloxane having an Si-bonded hydroxyl group in each of its terminal units and approximately 100 silicon atoms per molecule, 80 g of the dimethylpolysiloxane having an SiC-bonded acryloxypropyl group in each of its terminal units which was prepared in accordance with (A) above, and 1.1 ml of a 25 percent solution of phosphoronitrile chloride in methylene chloride are added to 966 g of a 45 percent solution of a methylhydrogenpolysiloxane having an Si-bonded hydroxyl group in each of its terminal units and having about 20 Si atoms per molecule, in toluene. The resultant mixture is refluxed for 2 hours until about 300 ml of water and toluene are distilled off. The contents of the flask are then mixed with 1.1 ml of trioctylamine in order to neutralize the phosphoronitrile chloride, filtered through activated charcoal and placed in a rotating evaporator to remove the solvents and other volatile materials at 80° C. and $1.3 \cdot 10^2$ Pa (abs.). About 973 g (93 percent of theory) of an organopolysiloxane are otained, which has units of the formula $$CH_2{=}CHCOO(CH_2)_3Si(CH_3)_2O_{\frac{1}{2}}, (CH_3)_2SiO \text{ and } CH_3HSiO,$$

a viscosity of 420 mPa.s at 25° C. and contains 0.66 percent of Si-bonded hydrogen, which indicates that it contains about 45.2 percent of units of the formula $$CH_3HSiO$$

based on the total number of siloxane units. The proportion of units of the formula $$(CH_3)_2SiO$$

based on the total number of siloxane units is 53.8 percent.

EXAMPLE 2

About 100 parts of the organopolysiloxane containing SiC-bonded acryloxyalkyl groups and Si-bonded hydrogen in the same molecule and whose preparation was described in Example (1), are mixed with 0.1 part of xanthone and applied with the aid of a doctor blade, to a paper which has been sized with polyvinyl alcohol at the rate of 5.2 g/m². The doctor blade consists of a stainless rod surrounded by a 0.2 mm thick stainless steel wire.

A 2 cm wide and 49 cm long strip of the coated paper is placed on a cylinder with the coated side facing away from the cylinder. A mercury high-pressure ultraviolet lamp with a power of 100 Watt/cm of illumination surface and a maximum power at 253.7 nm is mounted over the cylinder at a distance of 2 cm. The cylinder is driven by an electric motor at 32 rpm. The rotation rate of the cylinder and the diameter of the ultraviolet lamp produce an irradiation time of 2.4 seconds for a rotation period of 1 minute. A fresh air blower maintains the temperature between the lamp and the paper at 60° C.

After the paper has been removed from the cylinder, a pressure-sensitive 2 cm wide adhesive band ("Tesafilm rot No. 154", Beiersdorf AG, Hamburg, West Germany—"Tesa" is a registered trademark) is placed on the coated side of the paper and pressed down with the aid of a rubber roller with a force of 20N. After heating for 20 hours at 70° C. under a pressure of 0.2 N/cm², the pressure-sensitive band is removed from the paper at an angle of 180° and at a rate of 15 cm/minute. The force required for removing the pressure-sensitive band which is referred to as the "separation factor" is then measured.

(I) The pressure-sensitive strips removed from the organopolysiloxane-coated paper are then applied to an untreated acetate foil with the same force with which they were previously applied to the coated paper and then removed from said foil at an angle of 180° and at a rate of 7.5 cm/minute.

(II) A pressure-sensitive band of the above-described type is applied to an untreated acetate foil with the same force with which it is applied to the coated paper. After heating 20 hours at 70° C. under a pressure identical to that used to apply the pressure-sensitive band to the coated paper, the band is removed at an angle of 180° at the rate of 7.5 cm/minute and at a temperature of 20° C. The force required to remove the pressure-sensitive band is referred to as the "blind factor".

The force referred to in the following as "percent residual adhesion" is calculated as follows:

$$\frac{\text{(Force, measured according to I)}}{\text{(Blind factor, measured according to II)}} \times 100 = \text{Percent Residual Adhesion}$$

The following results are obtained:

| Irradiation time in seconds | Separation factor mN/mm | Residual Adhesion % |
|---|---|---|
| 7.2 | 5.4 | 66 |
| 12.0 | 6.8 | 79 |
| 16.8 | 7.9 | 82 |

After the coating had been irradiated as indicated above, it could be rubbed with the finger without causing any abrasion.

EXAMPLE 3

The procedure described in Example (2) is repeated, except that 1 part of benzoin methylether is substituted for the 0.1 part xanthone. The results are as follows:

| Irradiation time in seconds | Separation factor mN/mm | Residual Adhesion % |
|---|---|---|
| 12 | 6.8 | 57 |
| 16.8 | 6.9 | 67 |

COMPARISON EXAMPLES (A) THROUGH (C)

(a) The procedure described in Example (2) is repeated, except that an organopolysiloxane having the following formula $$CH_2{=}CHCOO(CH_2)_3Si(CH_3)_2O[Si(CH_3)_2O]_{19}{-}oSi(CH_3)_2(CH_2)_3OOCHC{=}CH_2$$

and a viscosity of 410 mPa.s at 25° C., is substituted for the organopolysiloxane containing both acryloxyalkyl groups and Si-bonded hydrogen in the same molecule. Also, 0.2 parts of xanthone are used instead of 0.1 part of xanthone for each 100 parts of organopolysiloxane.

(b) The procedure described in Comparison Example (a) above is repeated, except that 1 part of 2,4-bis-(trimethylsiloxy)-benzophenone is substituted for the 0.2 parts of xanthone.

(c) The procedure described in Comparison Example (a) above is repeated, except that 1 part of benzoin methylether is substituted for the 0.2 parts of xanthone.

In none of the above examples does an irradiation time of 48 seconds bring about cross-linking of the coatings.

EXAMPLE 4

About 100 parts of the organopolysiloxane prepared in accordance with Example (1), which contains acryloxyalkyl groups and Si-bonded hydrogen in the same molecule are mixed with 0.18 parts of xanthone. With the aid of a continuously operating multi-cylinder system, the mixture is then applied to 0.8 meter wide calendered Kraft paper at the rate of 0.56 to 0.67 g/m$^2$, which corresponds to a coating thickness of about 0.56 to 0.67 micrometer. This coating is then cross-linked by four mercury high-pressure ultraviolet lamps which are arranged in sequence over an 80 cm length and at a distance of 2 cm from the paper. The power of the ultraviolet lamps is 4.5 kilowatt with a maximum of 253.7 nm, while the paper moves at a maximum rate of 20 meters per minute. An increase in the power of the lamp by 1 kilowatt provides for an increase of 4.45 meters per minute in the speed with which the paper moves.

Instead of "Tesafilm rot No. 154", "Tesafilm No. 969" is used to test the properties of the coating.
Separation factor: 16.5 mN/mm
Residual adhesion: 86 percent

EXAMPLE 5

An organopolysiloxane prepared in accordance with the procedure described in Example (1), and having units of the formula CH$_2$=CHCOO(CH$_2$)$_3$Si(CH$_3$)O$_{\frac{1}{2}}$, (CH$_3$)$_2$SiO, and CH$_3$HSiO, in which the proportion of the diorganosiloxane units is about 35.9 percent based on the total number of siloxane units present, and methylhydrogensiloxane units are present in an amount of about 63.4 percent, based on the total number of the siloxane units present and having a viscosity of 360 mPa.s at 25° C., is mixed with 0.2 percent by weight of xanthone and applied with a doctor blade in accordance with Example (2) at the rate of 5.5 g/m$^2$ to polyvinyl alcohol-coated Kraft paper, and then crosslinked and tested in accordance with the procedure of Example (2).

| Irradiation time in seconds | Separation factor mN/mm | Residual Adhesion % |
|---|---|---|
| 7.2 | 7.3 | 63 |
| 12.0 | 9.7 | 77 |
| 16.8 | 9.8 | 72 |
| 24.0 | 10.5 | 81 |
| 36.0 | 13.0 | 84 |

When the coating was rubbed with a finger following 7.2 seconds of irradiation, a moderate amount of abrasion was observed. No evidence of any abrasion was observed with the other irradiation times.

EXAMPLES 6 THROUGH 9

Organopolysiloxanes consisting of units of the following formula

which were prepared in accordance with the procedure in Example (1) and containing the other units indicated in the following table, are mixed with the photosensitizers listed in the following table and applied with the aforementioned doctor blade to polyvinyl alcohol-coated paper at the rate of 5.2 g/m$^2$ and cross-linked by irradiation for 12.0 seconds with the equipment described in Example (2).

TABLE

| Example | Ratio of CH$_3$HSiO:(CH$_3$)$_2$SiO | Number of siloxane units (except terminal units) CH$_3$HSiO Percent | (CH$_3$)$_2$SiO Percent | Viscosity of organopoly- siloxanes mPa.s at 25° C. | Photosensitizer Type | Amount % | Residual adhesion factor % |
|---|---|---|---|---|---|---|---|
| 6 | 1:1.3 | 43 | 57 | 500 | 2,4-bis-methyl-siloxy)-benzo-phenone | 1.0 | 75 |
| 7 | 1:8 | 11.1 | 88.9 | 500 | 2,4-bis methyl-siloxy)-benzo-phenone | 2.0 | 73 |
| 8 | 1:1.05 | 47.5 | 62.5 | 680 | Xanthone | 0.1 | 87 |
| 9 | 1:1.7 | 37 | 63 | 630 | Xanthone | 0.1 | 72 |

What is claimed is:

1. A method for coating a substrate which comprises applying an orgnopolysiloxane having a viscosity of at least 100 mPa.s at 25° C. and having SiC-bonded acryloxyalkyl groups and Si-bonded hydrogen in the same molecule to a substrate and thereafter crosslinking the organopolysiloxane with a source of radiation.
2. The method of claim 1, wherein the organopolysiloxane contains a photosensitizer.
3. The method of claim 1, wherein the substrate is a paper substrate.
4. The method of claim 2, wherein the source of high-energy radiation is ultraviolet light.
5. The method of claim 1, wherein the substrate is a textile substrate.
6. The method of claim 2, wherein the photosensitizer is present in an amount of from 0.5 to about 5 percent by weight based on the weight of the organopolysiloxane.

* * * * *